United States Patent
Okaguchi

(10) Patent No.: US 10,511,236 B2
(45) Date of Patent: Dec. 17, 2019

(54) PIEZOELECTRIC DEVICE DRIVE CIRCUIT AND SUCTION APPARATUS

(71) Applicant: Murata Manufacturing Co., Ltd., Kyoto (JP)

(72) Inventor: Kenjiro Okaguchi, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 403 days.

(21) Appl. No.: 15/403,552

(22) Filed: Jan. 11, 2017

(65) Prior Publication Data

US 2017/0126148 A1 May 4, 2017

Related U.S. Application Data

(63) Continuation of application No. PCT/JP2015/069391, filed on Jul. 6, 2015.

(30) Foreign Application Priority Data

Jul. 14, 2014 (JP) .................................. 2014-144045

(51) Int. Cl.
*H02N 2/00* (2006.01)
*F04B 17/00* (2006.01)
*H01L 41/04* (2006.01)

(52) U.S. Cl.
CPC .......... *H02N 2/008* (2013.01); *F04B 17/003* (2013.01); *H01L 41/042* (2013.01)

(58) Field of Classification Search
CPC ...... H02N 2/008; F04B 17/003; H01L 41/042
(Continued)

(56) References Cited

U.S. PATENT DOCUMENTS

2002/0057040 A1* 5/2002 Shibatani ............ H01L 41/0906
310/323.16
2007/0080606 A1* 4/2007 Hardy ................. F02D 41/2096
310/316.03
(Continued)

FOREIGN PATENT DOCUMENTS

JP 59-56990 U 4/1984
JP H04-145874 A 5/1992
(Continued)

OTHER PUBLICATIONS

International Search Report issued in Application No. PCT/JP2015/069391 dated Sep. 29, 2015.
(Continued)

*Primary Examiner* — Bryan P Gordon
(74) *Attorney, Agent, or Firm* — Pearne & Gordon LLP

(57) ABSTRACT

A piezoelectric device drive circuit applies a drive signal to a piezoelectric device. An H-bridge circuit includes a first input terminal, a second input terminal, a first output terminal, and a second output terminal, the first output terminal and the second output terminal being connected to the piezoelectric device. A resistor is connected between the piezoelectric device and the first output terminal. A differential amplifier circuit receives, as an input, a voltage across the resistor. An inverting circuit has an input terminal connected to an output terminal of the differential amplifier circuit. A comparator has an input terminal connected to an input terminal of the inverting circuit, and an output terminal connected to the first input terminal. A comparator has an input terminal connected to an output terminal of the inverting circuit, and an output terminal connected to the second input terminal.

8 Claims, 5 Drawing Sheets

(58) Field of Classification Search
USPC .......................................................... 310/317
See application file for complete search history.

(56) References Cited

U.S. PATENT DOCUMENTS

| | | | | |
|---|---|---|---|---|
| 2009/0115508 | A1* | 5/2009 | Cheng | H03F 1/32 |
| | | | | 330/10 |
| 2011/0068657 | A1* | 3/2011 | Sunaga | H01L 41/042 |
| | | | | 310/316.01 |
| 2013/0271044 | A1* | 10/2013 | Yamaguchi | B06B 1/0207 |
| | | | | 318/116 |
| 2014/0285065 | A1 | 9/2014 | Okaguchi | |

FOREIGN PATENT DOCUMENTS

| | | |
|---|---|---|
| JP | 2007-100704 A | 4/2007 |
| WO | 2013/084709 A1 | 4/2015 |

OTHER PUBLICATIONS

Written Opinion issued in Application No. PCT/JP2015/069391 dated Sep. 29, 2015.

* cited by examiner

PIEZOELECTRIC DEVICE DRIVE CIRCUIT AND SUCTION APPARATUS

This is a continuation of International Application No. PCT/JP2015/069391 filed on Jul. 6, 2015 which claims priority from Japanese Patent Application No. 2014-144045 filed on Jul. 14, 2014. The contents of these applications are incorporated herein by reference in their entireties.

BACKGROUND OF THE DISCLOSURE

Field of the Disclosure

The present disclosure relates to a piezoelectric device drive circuit that applies a drive signal to a piezoelectric device, and a suction apparatus including the same.

Description of the Related Art

An exemplary piezoelectric device drive circuit of the related art includes one described in Patent Document 1. This piezoelectric device drive circuit includes an H-bridge circuit, a differential amplifier circuit, an amplifier circuit, and an inverting circuit. The H-bridge circuit generates a drive signal on the basis of a first control signal and a second control signal. The generated drive signal is applied to a piezoelectric device. The differential amplifier circuit generates a differential signal on the basis of the drive signal. The amplifier circuit amplifies the differential signal and outputs the amplified signal. This output signal becomes the first control signal, and, when the phase of this output signal is inverted by the inverting circuit, the phase-inverted signal becomes the second control signal. In this piezoelectric device drive circuit, positive feedback is performed. Accordingly, the piezoelectric device can be driven at a resonant frequency thereof.

Patent Literature 1: International Publication No. 2013/084709

BRIEF SUMMARY OF THE DISCLOSURE

Matters examined by the inventors will be described below.

The piezoelectric device drive circuit described in Patent Document 1 is used for driving, for example, a piezoelectric device provided in a piezoelectric pump. To increase the work amount of this piezoelectric pump, it is necessary to raise a drive voltage applied to the piezoelectric device. When the drive voltage becomes higher, high-withstand-voltage circuit components (integrated circuits (ICs), resistors, capacitors, and the like) need to be used in the piezoelectric device drive circuit. However, such high-withstand-voltage circuit components tend to be larger, resulting in an increase in the circuit area of the piezoelectric device drive circuit.

In many cases, a battery or a rechargeable lithium-ion battery (LIB) is used as the power source of the piezoelectric device drive circuit. To raise the drive voltage in this case, it is necessary to boost a power supply voltage to a high voltage using a booster circuit, and to supply the boosted voltage to the piezoelectric device drive circuit. However, when a voltage is boosted with a high boosting ratio, the power conversion efficiency of the booster circuit may be lowered.

It is an object of the present disclosure to provide a piezoelectric device drive circuit that can lower a drive voltage necessary for obtaining a desired work amount, and a suction apparatus including the same.

A piezoelectric device drive circuit according to the present disclosure applies a drive signal to a piezoelectric device. The piezoelectric device drive circuit according to the present disclosure includes an H-bridge circuit, a current detecting resistor, a differential amplifier circuit, an inverting circuit, a first slew rate increasing circuit, and a second slew rate increasing circuit. The H-bridge circuit includes a first input terminal, a second input terminal, a first output terminal, and a second output terminal, the first output terminal and the second output terminal being connected to the piezoelectric device. The current detecting resistor is connected between the piezoelectric device and the first output terminal. The differential amplifier circuit receives voltages at two ends of the current detecting resistor. The inverting circuit has an input terminal connected to an output terminal of the differential amplifier circuit. The first slew rate increasing circuit has an input terminal connected to an input terminal of the inverting circuit, and an output terminal connected to the first input terminal. The second slew rate increasing circuit has an input terminal connected to an output terminal of the inverting circuit, and an output terminal connected to the second input terminal.

In this configuration, the slew rates of a first control signal and a second control signal of the H-bridge circuit increase with the use of the first slew rate increasing circuit and the second slew rate increasing circuit. Therefore, the drive signal applied to the piezoelectric device becomes close to a rectangular wave, and accordingly the drive signal voltage average becomes greater among the drive signals with the same magnitude (amplitude). In other words, a drive voltage can be lowered without changing the drive signal voltage average. In contrast, the work amount of a piezoelectric pump increases monotonically with respect to the drive signal voltage average. Therefore, the drive voltage can be lowered even in the case of obtaining the same work amount.

Note that the voltage average indicates an area surrounded by the waveform thereof. A rectangular wave has the largest average among other waveforms with the same amplitude.

Because the drive voltage becomes lower, small components having a low-withstand-voltage can be used in the piezoelectric device drive circuit. Therefore, the circuit area of the piezoelectric device drive circuit can be reduced. Whereas a voltage boosted by a booster circuit is supplied to the piezoelectric device drive circuit, because the drive voltage becomes lower, the boosting ratio of the booster circuit can be lowered. Therefore, the power conversion efficiency of the booster circuit can be improved even in the case of obtaining the same work amount. Because the drive voltage becomes lower, the power consumption can be reduced even in the case of obtaining the same work amount. Because the power consumption is reduced, not only the power source of the piezoelectric device drive circuit, such as a battery, but also a suction apparatus including the same can be made smaller and lighter.

In the piezoelectric device drive circuit according to the present disclosure, it is preferable that the first slew rate increasing circuit and the second slew rate increasing circuit each output a rectangular wave with a duty ratio of 50%. Because the drive signal becomes a rectangular wave in this configuration, the drive voltage may be minimized without changing the drive signal voltage average. Therefore, the drive voltage can be lowered the most for the same work amount.

It is preferable that the piezoelectric device drive circuit according to the present disclosure include a first low-pass filter and a second low-pass filter. The first low-pass filter is connected between the first input terminal and the output terminal of the first slew rate increasing circuit. The second low-pass filter is connected between the second input terminal and the output terminal of the second slew rate increasing circuit.

Because a process in which the level (potential) of the drive signal which is at its maximum voltage or minimum voltage returns to the midpoint voltage is a process in which the electric charge accumulated in the piezoelectric pump is discharged, no electric power is consumed in that process. Because the configuration of the present disclosure generates a small amount of time where the level of the drive signal becomes the midpoint voltage with the use of the first low-pass filter and the second low-pass filter, the power consumption is reduced. In contrast, because the drive signal only becomes slightly deformed from a rectangular wave, there is almost no reduction in the drive signal voltage average. Therefore, the power consumption can be reduced while having almost no reduction in the work amount.

A suction apparatus according to the present disclosure performs suction using a piezoelectric pump driven by the piezoelectric device drive circuit according to the present disclosure. In this configuration, the suction apparatus with the above-mentioned advantageous effects can be obtained.

According to the present disclosure, a desired work amount can be obtained with a low drive voltage.

DETAILED DESCRIPTION OF THE DISCLOSURE

Figure 1:
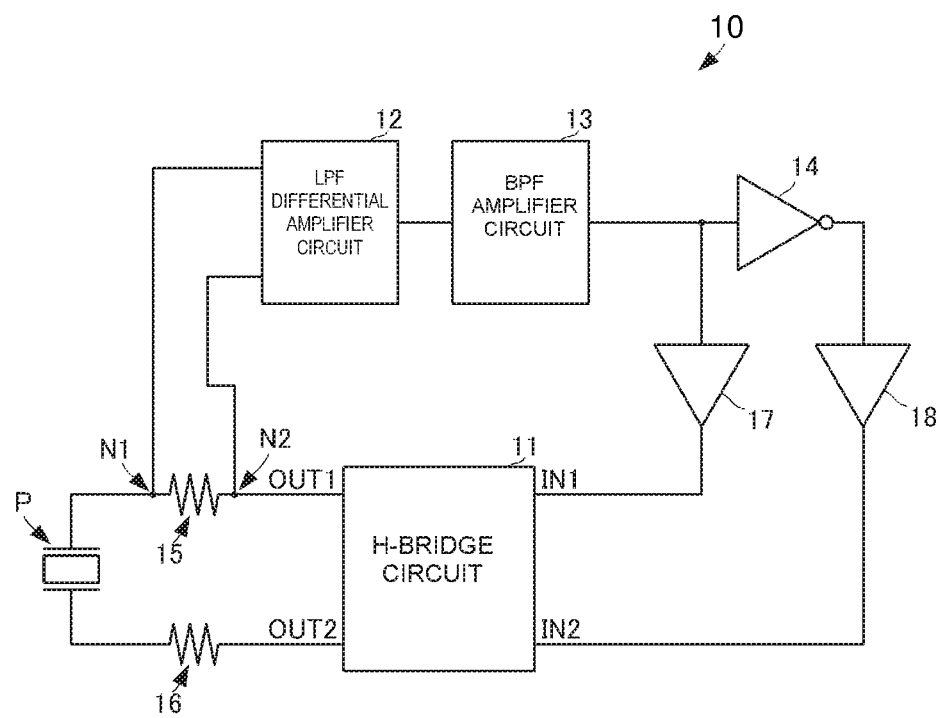
FIG. 1 is a circuit diagram of a piezoelectric device drive circuit according to a first embodiment.

A piezoelectric device drive circuit 10 according to a first embodiment of the present disclosure will be described with reference to the drawings. FIG. 1 is a circuit diagram of the piezoelectric device drive circuit 10 according to the first embodiment of the present disclosure. The piezoelectric device drive circuit 10 includes an H-bridge circuit 11, a differential amplifier circuit with a low-pass filter (hereinafter referred to as an "LPF differential amplifier circuit") 12, an amplifier circuit with a band-pass filter (hereinafter referred to as a "BPF amplifier circuit") 13, an inverting circuit 14, resistors 15 and 16, and comparators 17 and 18. The comparator 17 corresponds to a "first slew rate increasing circuit" of the present disclosure. The comparator 18 corresponds to a "second slew rate increasing circuit" of the present disclosure.

The H-bridge circuit 11 includes a plurality of field-effect transistors (FETs). The H-bridge circuit 11 includes a first input terminal IN1, a second input terminal IN2, a first output terminal OUT1, and a second output terminal OUT2. When the level (potential) of a first control signal inputted to the first input terminal IN1 is greater than or equal to a switching threshold $V_{TH}1$ and the level of a second control signal inputted to the second input terminal IN2 is less than a switching threshold $V_{TH}2$, the H-bridge circuit 11 raises the level of a first drive signal outputted from the first output terminal OUT1 to a high level and lowers the level of a second drive signal outputted from the second output terminal OUT2 to a low level. When the level of the first control signal is less than the switching threshold $V_{TH}1$ and the level of the second control signal is greater than or equal to the switching threshold $V_{TH}2$, the H-bridge circuit 11 lowers the level of the first drive signal to a low level and raises the level of the second drive signal to a high level. When the level of the first control signal is greater than or equal to the switching threshold $V_{TH}1$ and the level of the second control signal is greater than or equal to the switching threshold $V_{TH}2$, the H-bridge circuit 11 lowers the level of the first drive signal and the second drive signal to a low level. When the level of the first control signal is less than the switching threshold $V_{TH}1$ and the level of the second control signal is less than the switching threshold $V_{TH}2$, the H-bridge circuit 11 causes the first output terminal OUT1 and the second output terminal OUT2 to have high impedance. In the following description, the difference between the first drive signal and the second drive signal is simply referred to as a drive signal.

The first input terminal IN1 is connected to an output terminal of the comparator 17. The second input terminal IN2 is connected to an output terminal of the comparator 18. The first output terminal OUT1 is connected to a first terminal of a piezoelectric device P. The resistor 15, serving as a current detecting resistor, is connected between the first output terminal OUT1 and the first terminal of the piezoelectric device P. The second output terminal OUT2 is connected to a second terminal of the piezoelectric device P. The resistor 16 is connected between the second output terminal OUT2 and the second terminal of the piezoelectric device P. The resistors 15 and 16 exhibit the same characteristics (resistance and the like). The first output terminal OUT1 and the second output terminal OUT2 perform balance drivings with the same voltage but with phases that are different by 180°.

Two ends N1 and N2 of the resistor 15 are respectively connected to input terminals of the LPF differential amplifier circuit 12. The LPF differential amplifier circuit 12 operates in accordance with the difference between voltages at both ends of the resistor 15 in accordance with a drive current applied to the piezoelectric device P, and outputs a differential signal. The LPF of the LPF differential amplifier circuit 12 is set such that the LPF's passband becomes the resonant frequency of the piezoelectric device P in a certain vibrating mode and the LPF's attenuation band becomes frequencies higher than or equal to the third harmonic of that resonant frequency. Accordingly, harmonic components of the resonant frequency of the piezoelectric device P in the certain vibrating mode are suppressed.

An output terminal of the LPF differential amplifier circuit 12 is connected to an input terminal of the BPF amplifier circuit 13. The BPF amplifier circuit 13 amplifies the input differential signal by a predetermined gain and outputs the amplified signal. The BPF of the BPF amplifier circuit 13 is set such that the BPF's passband becomes the resonant frequency of the piezoelectric device P in a certain vibrating mode, and the BPF's attenuation band becomes the resonant frequencies of the piezoelectric device P in other vibrating modes different from the certain vibrating mode and the second harmonic of the resonant frequencies. Accordingly, resonant frequency components of the piezoelectric device P in vibrating modes other than the certain vibrating mode and the second harmonic components of the resonant frequencies are suppressed.

An output terminal of the amplifier circuit 13 is connected to an input terminal of the comparator 17 and to an input terminal of the inverting circuit 14. The output terminal of the comparator 17 is connected to the first input terminal IN1 of the H-bridge circuit 11, as described above. An output terminal of the inverting circuit 14 is connected to an input terminal of the comparator 18. The output terminal of the comparator 18 is connected to the second input terminal IN2 of the H-bridge circuit 11, as described above.

The inverting circuit 14 inverts the phase of an input signal without changing the amplitude of the input signal, and outputs the phase-inverted signal. When the level of the input signals is greater than or equal to a midpoint voltage $V_{MC}$, the comparators 17 and 18 raise the level of their output signals to a high level; and when the level of the input signals is less than the midpoint voltage $V_{MC}$, the comparators 17 and 18 lower the level of their output signals to a low level.

With such a configuration, a drive signal applied to the piezoelectric device P is fed back and used as a control signal of the H-bridge circuit 11. At this time, the element values and characteristics of circuit elements are set such that the gain of a feedback system at the resonant frequency of the piezoelectric device P in the certain vibrating mode is 1 or greater and the phase angle is 0°, thereby satisfying the Barkhausen oscillation conditions and realizing the driving of the piezoelectric device P at the resonant frequency.

Figure 2:
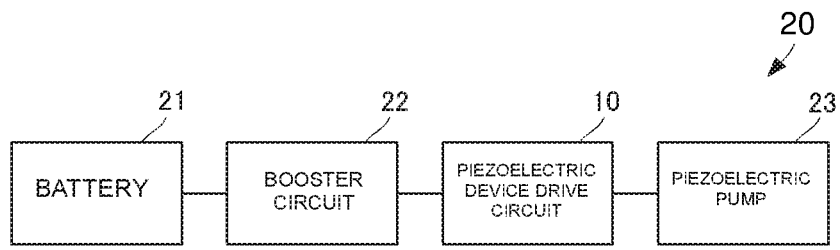
FIG. 2 is a block diagram of a suction apparatus according to the first embodiment.

FIG. 2 is a block diagram of a suction apparatus 20. The suction apparatus 20 includes a battery 21, a booster circuit 22, the piezoelectric device drive circuit 10, and a piezoelectric pump 23. The booster circuit 22 boosts the voltage of the battery 21 and outputs the boosted voltage. The voltage outputted from the booster circuit 22 is supplied to the piezoelectric device drive circuit 10. The piezoelectric device drive circuit 10 drives the piezoelectric device P of the piezoelectric pump 23, as described above. The piezoelectric pump 23 generates the suction power through the driving of the piezoelectric device P.

Figure 3:
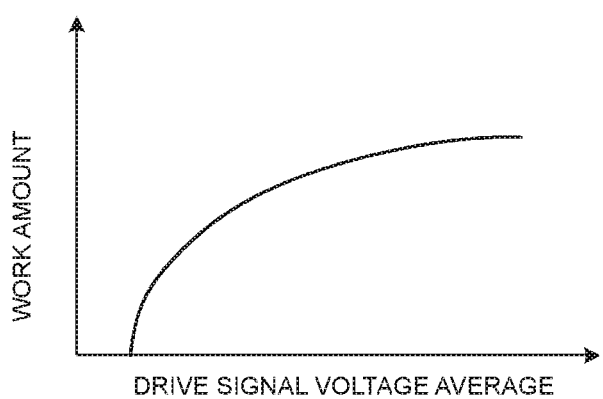
FIG. 3 is a schematic graph illustrating a work amount with respect to a drive signal voltage average.

FIG. 3 is a schematic graph illustrating a work amount with respect to a drive signal voltage average. Here, the drive signal voltage average is obtained by integrating the waveform of a drive signal applied to the piezoelectric device P for half the cycle with reference to a midpoint voltage, and dividing the integrated result by half the cycle. The midpoint voltage is a voltage (potential) equidistant from the maximum voltage and the minimum voltage of a signal. The work amount is the amount of work done on the fluid by the piezoelectric pump 23 per unit time. The work amount of the piezoelectric pump 23 is represented by the product of the difference between the pressure at an inlet and the pressure at an outlet of the piezoelectric pump 23 and the amount of the flow from the inlet to the outlet of the piezoelectric pump 23.

The work amount starts to increase when the drive signal voltage average becomes equal to or greater than a certain value, and becomes greater as the drive signal voltage average becomes higher. That is, the work amount becomes greater monotonically with respect to the drive signal voltage average. The increase rate of the work amount becomes moderate in an area where the drive signal voltage average is high. When the drive signal voltage average is within a certain range, it can be considered that the work amount is proportional to the drive signal voltage average.

Figure 4:
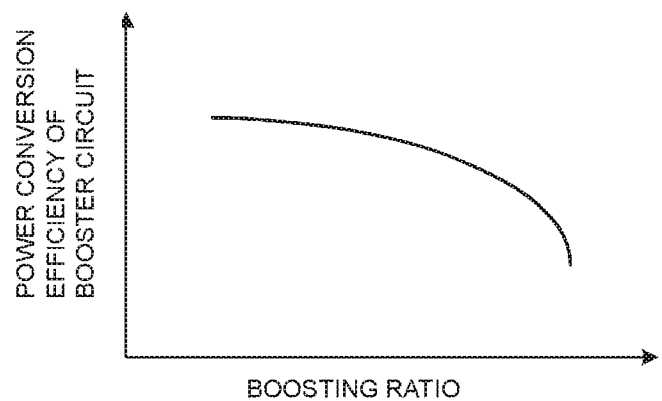
FIG. 4 is a schematic graph illustrating the power conversion efficiency of a booster circuit with respect to a boosting ratio.

FIG. 4 is a schematic graph illustrating the power conversion efficiency of the booster circuit 22 with respect to a boosting ratio. The boosting ratio is the ratio of the output voltage to the input voltage of the booster circuit 22. The power conversion efficiency of the booster circuit 22 is the ratio of the output power to the input power of the booster circuit 22. The power conversion efficiency of the booster circuit 22 becomes lower monotonically as the boosting ratio becomes higher. The reduction rate of the power conversion efficiency of the booster circuit 22 becomes drastic in an area where the boosting ratio is high.

Figure 5:
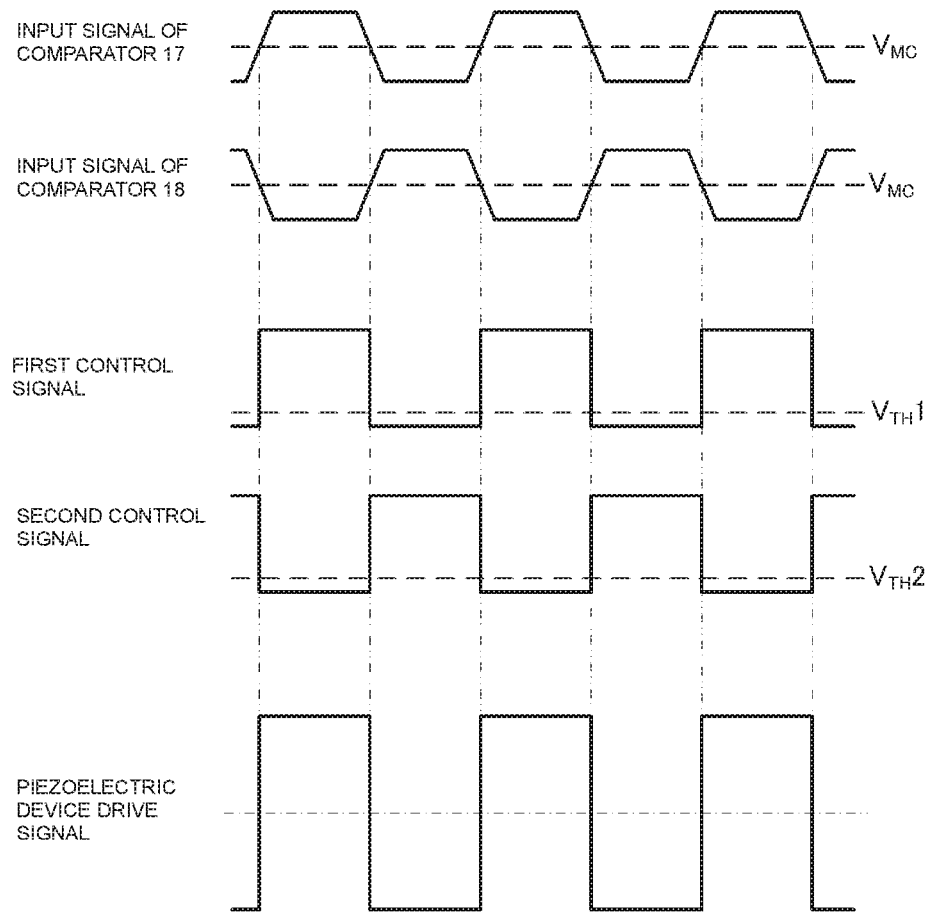
FIG. 5 is a schematic diagram illustrating the signal waveforms in the piezoelectric device drive circuit according to the first embodiment.

FIG. 5 is a schematic diagram illustrating the signal waveforms in the piezoelectric device drive circuit 10. In the BPF amplifier circuit 13, harmonic components and the like are suppressed, as described above. Therefore, the input signal of the comparator 17 becomes a trapezoidal wave. The inverting circuit 14 inverts the phase of the input signal and outputs the phase-inverted signal, as described above. Therefore, the input signal of the comparator 18 becomes a trapezoidal wave whose phase is inverted from that of the input signal of the comparator 17.

The comparators 17 and 18 compare the level of their input signals with an input signal midpoint voltage $V_{MC}$ and raise or lower the level of their output signals to a high level or a low level. Therefore, the output signal of the comparator 17, that is, the first control signal, becomes a rectangular wave with a duty ratio of 50%. The output signal of the comparator 18, that is, the second control signal, becomes a rectangular wave with a duty ratio of 50%, whose phase is inverted from the output signal of the comparator 17. That is, the comparators 17 and 18 increase the slew rates of their output signals with respect to the input signals. In addition, the comparator 18 is unnecessary when the slew rate of the inverting circuit 14 is sufficiently great, like the comparator 18. In the piezoelectric device drive circuit 10, a portion of the signal waveform higher than the midpoint voltage and a portion of the signal waveform lower than the midpoint voltage are symmetrical, reflecting the vibrating mode of the piezoelectric device P.

The switching threshold $V_{TH}1$ of the H-bridge circuit 11 is set to a level between the high level of the first control signal and the low level of the first control signal. The switching threshold $V_{TH}2$ of the H-bridge circuit 11 is set to a level between the high level of the second control signal and the low level of the second control signal. Therefore, the first drive signal and the first control signal have the same waveform and the same phase. The second drive signal and the second control signal have the same waveform and the same phase. As a result, a drive signal applied to the piezoelectric device P is a rectangular wave with a duty ratio of 50%, which has twice the amplitude of the first control signal or the second control signal.

Figure 6:
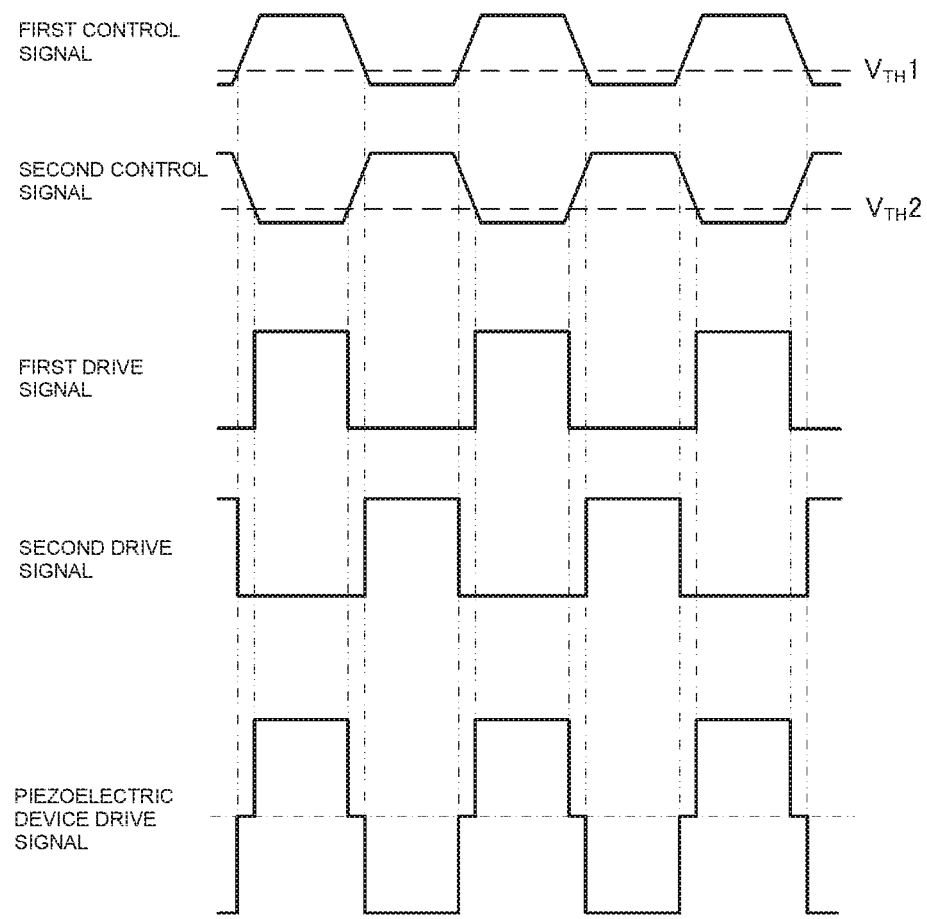
FIG. 6 is a schematic diagram illustrating the signal waveforms in a piezoelectric device drive circuit with a configuration of the related art.

FIG. 6 is a schematic diagram illustrating the signal waveforms in a piezoelectric device drive circuit with a configuration of the related art. The piezoelectric device drive circuit with the configuration of the related art is the same as the piezoelectric device drive circuit 10 except for the point that the former includes none of the comparators 17 and 18. The switching thresholds $V_{TH}1$ and $V_{TH}2$ are set to a level closer to the low level with respect to the first control signal and the second control signal. In the piezoelectric device drive circuit with the configuration of the related art, the first control signal and the second control signal become trapezoidal waves. Therefore, a period in which the first drive signal is at a high level is different from a period in which the second drive signal is at a low level, and a period in which the first drive signal is at a low level is different from a period in which the second drive signal is at a high level. As a result, a drive signal applied to the piezoelectric device P becomes a podium-shaped wave whose level changes in a staircase pattern. Actually, it is difficult to adjust the switching thresholds $V_{TH}1$ and $V_{TH}2$ such that a drive signal applied to the piezoelectric device P becomes a rectangular wave.

Figure 7A:
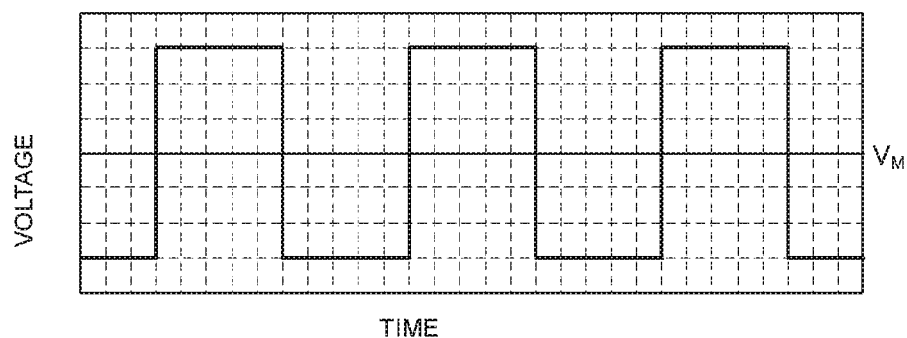
FIG. 7A is a schematic diagram illustrating the waveform of a drive signal in the piezoelectric device drive circuit according to the first embodiment.
Figure 7B:
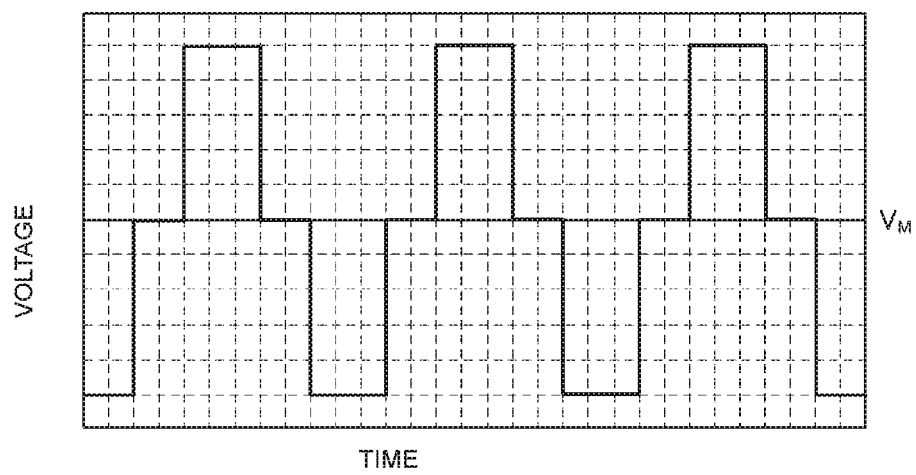
FIG. 7B is a schematic diagram illustrating the waveform of a drive signal in the piezoelectric device drive circuit with the configuration of the related art.

FIG. 7A is a schematic diagram illustrating the waveform of a drive signal in the piezoelectric device drive circuit 10. FIG. 7B is a schematic diagram illustrating the waveform of a drive signal in the piezoelectric device drive circuit with the configuration of the related art. Here, the vertical axis represents the standardized voltage, and the horizontal axis represents the standardized time. $V_m$ represents the midpoint voltage of a drive signal.

The drive signal voltage average of the piezoelectric device drive circuit 10 is three. The drive signal voltage average of the piezoelectric device drive circuit with the configuration of the related art is also three. That is, the piezoelectric device drive circuit 10 and the piezoelectric device drive circuit with the configuration of the related art have an identical drive signal voltage average. In contrast, the work amount of the piezoelectric pump 23 increases monotonically with respect to the drive signal voltage average, as described above. Therefore, the suction apparatus 20 including the piezoelectric device drive circuit 10 and a suction apparatus including the piezoelectric device drive circuit with the configuration of the related art are equal in the work amount of the piezoelectric pump 23. The drive voltage (the amplitude of the drive signal) of the piezoelectric device drive circuit 10 is three. The drive signal of the piezoelectric device drive circuit with the configuration of the related art is five. That is, the drive voltage of the piezoelectric device drive circuit 10 is lower than the drive voltage of the piezoelectric device drive circuit with the configuration of the related art.

Therefore, the piezoelectric device drive circuit 10 can have a lower drive voltage than the piezoelectric device drive circuit with the configuration of the related art even when obtaining the same work amount. When the drive voltage becomes lower, the boosting ratio of the booster circuit 22 can be set to a lower ratio. As described above, when the boosting ratio of the booster circuit 22 becomes lower, the power conversion efficiency of the booster circuit 22 becomes higher. Therefore, the piezoelectric device drive circuit 10 can maintain the power conversion efficiency of the booster circuit 22 to be high even when obtaining the same work amount, compared with the piezoelectric device drive circuit with the configuration of the related art.

Figure 8:
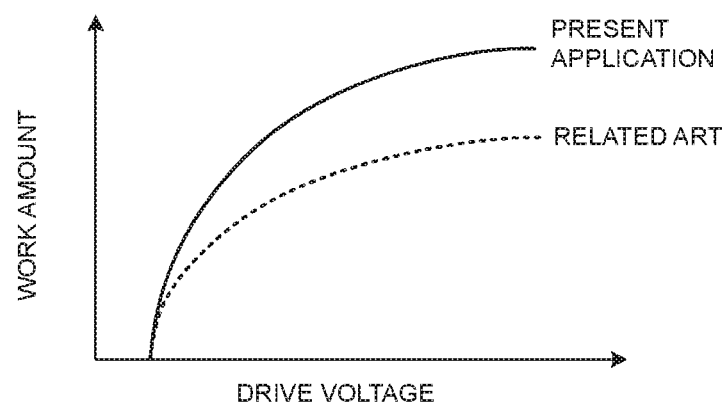
FIG. 8 is a schematic graph illustrating a work amount with respect to a drive voltage.

FIG. 8 is a schematic graph illustrating the work amount with respect to the drive voltage. A solid line represents the characteristics of the suction apparatus 20, and a broken line represents the characteristics of a suction apparatus with a configuration of the related art. The suction apparatus with the configuration of the related art is the same as the suction apparatus 20 except for the point that the piezoelectric device drive circuit with the configuration of the related art is used instead of the piezoelectric device drive circuit 10.

The work amount of the suction apparatus 20 starts to increase when the drive voltage becomes a certain value or greater, and becomes greater as the drive voltage becomes higher. That is, the work amount becomes greater monotonically with respect to the drive voltage. The increase rate of the work amount becomes moderate in an area where the drive voltage is high. Like the suction apparatus 20, the work amount of the suction apparatus with the configuration of the related art becomes greater monotonically with respect to the drive voltage. However, the increase rate of the work amount of the suction apparatus with the configuration of the related art is moderate, compared with the suction apparatus 20.

The drive voltage for the same work amount is lower in the suction apparatus 20 than in the suction apparatus with the configuration of the related art. In other words, the work amount for the drive voltage with the same magnitude is greater in the suction apparatus 20 than in the suction apparatus with the configuration of the related art. This is because the piezoelectric device drive circuit 10 can obtain the same drive signal voltage average with a lower drive voltage than that in the piezoelectric device drive circuit with the configuration of the related art.

In the first embodiment, trapezoidal waves are changed to rectangular waves with a duty ratio of 50% using the comparators 17 and 18, thereby changing a drive signal applied to the piezoelectric device P to a rectangular wave with a duty ratio of 50%. This drive signal voltage average reaches a maximum value among drive signals with the same drive voltage. In other words, the drive voltage can be lowered without changing the drive signal voltage average. In contrast, the work amount of the piezoelectric pump 23 increases monotonically with respect to the drive signal voltage average, as described above. Therefore, the drive voltage can be lowered even in the case of obtaining the same work amount. Since the work amount of the piezoelectric pump 23 is the product of the pressure and the flow rate of the piezoelectric pump 23 as described above, the drive voltage can also be lowered without lowering the pressure and the flow rate of the piezoelectric pump 23.

Because not only the drive voltage but also the boosting ratio of the booster circuit 22 becomes lower, small components having a low-withstand-voltage can be used in the piezoelectric device drive circuit 10 and the booster circuit 22. Accordingly, the circuit area of the piezoelectric device drive circuit 10 and the booster circuit 22 can be reduced. As described above, when the boosting ratio of the booster circuit 22 becomes lower, the power conversion efficiency of the booster circuit 22 becomes higher. Therefore, the power conversion efficiency of the booster circuit 22 can be improved even in the case of obtaining the same work amount.

Because the drive voltage becomes lower, the power consumption can be reduced even in the case of obtaining the same work amount. Furthermore, because the power consumption is reduced, the battery 21, which is the power source of the piezoelectric device drive circuit 10, can be made smaller and lighter. Because the battery 21 has a large factor in terms of size and weight in the suction apparatus 20, the size and weight of the suction apparatus 20 can be reduced.

A drive signal with a rectangular wave does not contribute to an increase in the work amount and includes harmonic components that only consume power. Therefore, the advantageous effects of the present disclosure are more significant when a power loss caused by having a high drive voltage is greater than a power loss caused by having a drive signal with a rectangular wave.

Second Embodiment

Figure 9:
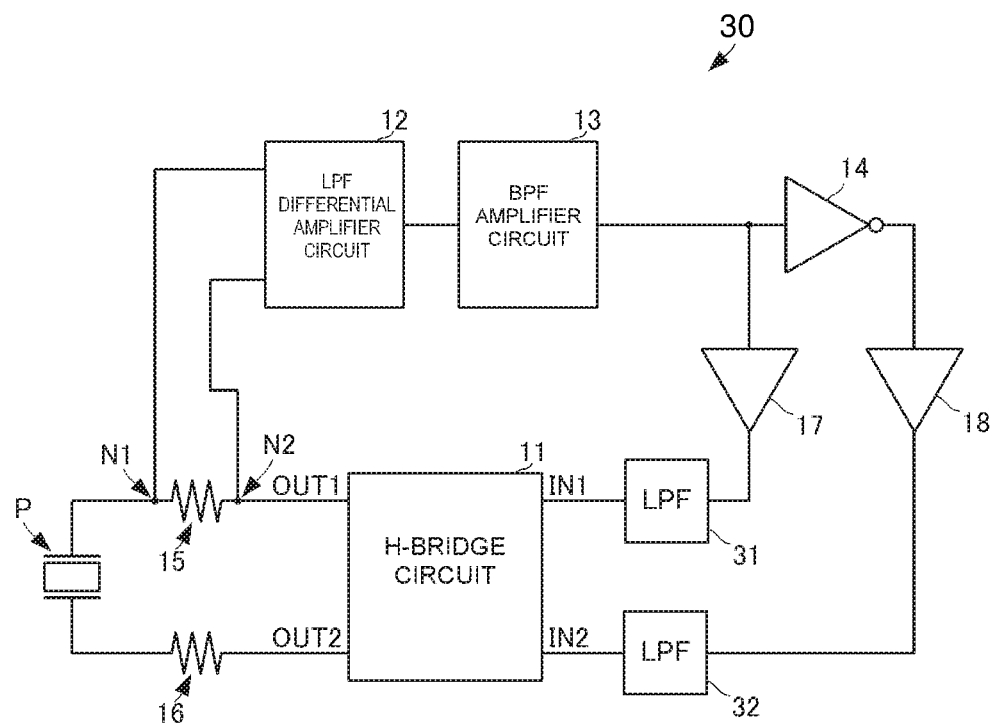
FIG. 9 is a circuit diagram of a piezoelectric device drive circuit according to a second embodiment.

A piezoelectric device drive circuit 30 according to a second embodiment of the present disclosure will be described with reference to the drawings. FIG. 9 is a circuit diagram of the piezoelectric device drive circuit 30 according to the second embodiment of the present disclosure. A low-pass filter 31 is connected between the output terminal of the comparator 17 and the first input terminal IN1 of the H-bridge circuit 11. A low-pass filter 32 is connected between the output terminal of the comparator 18 and the second input terminal IN2 of the H-bridge circuit 11. The low-pass filter 31 corresponds to a "first low-pass filter" of the present disclosure. The low-pass filter 32 corresponds to a "second low-pass filter" of the present disclosure. The other configuration of the piezoelectric device drive circuit 30 is the same as the configuration of the piezoelectric device drive circuit 10 according to the first embodiment.

The low-pass filters 31 and 32 remove harmonic components of the resonant frequency of the piezoelectric device P, thereby slightly shaping the first control signal and the second control signal to be trapezoidal waves. This generates a small amount of time where the level of a drive signal applied to the piezoelectric device P becomes the midpoint voltage.

Because a process in which the level of the drive signal which is at its maximum voltage or minimum voltage returns to the midpoint voltage is a process in which electric charge accumulated in the piezoelectric pump 23 is discharged, no electric power is consumed in that process. Because the level of the drive signal changes over the midpoint voltage as described above, the power consumption is reduced in the second embodiment. In contrast, because the drive signal slightly becomes a podium-shaped wave, there is almost no reduction in the drive signal voltage average. Therefore, the power consumption can be reduced while having almost no reduction in the work amount of the piezoelectric pump 23.

Although the piezoelectric device drive circuits according to the above-described embodiments have the comparators 17 and 18, the piezoelectric device drive circuit according to the present disclosure is not limited thereto. The piezoelectric device drive circuit according to the present disclosure may include inverters in place of the comparators 17 and 18.

Although the first control signal and the second control signal become rectangular waves with the use of the comparators 17 and 18 in the above-described embodiments, the present disclosure is not limited thereto. It is only necessary in the present disclosure that the slew rates of the first control signal and the second control signal increase with the use of slew rate increasing circuits. Since a drive signal applied to the piezoelectric device in this case also becomes close to a rectangular wave, the advantageous effects of the present disclosure can be achieved to a certain degree.

Although the piezoelectric device drive circuit according to the second embodiment has the low-pass filters 31 and 32, the piezoelectric device drive circuit according to the present disclosure is not limited thereto. The piezoelectric device drive circuit according to the present disclosure may include band-pass filters in place of the low-pass filters 31 and 32. Even in this case, the first control signal and the second control signal can be slightly shaped to trapezoidal waves.

Because harmonic components and the like are suppressed by the BPF amplifier circuit 13 in the above-described embodiments, the input signal of the comparator 17 becomes a trapezoidal wave. However, even when no low-pass filter of the differential amplifier circuit 12 is provided or no band-pass filter of the amplifier circuit 13 is provided, the waveforms of voltages at both ends of the resistor 15 do not necessarily become rectangular waves. Thus, the input signals of the comparators 17 and 18 become waves whose shapes are deformed from rectangular waves. Therefore, the present disclosure is useful even when no low-pass filter of the differential amplifier circuit 12 is provided or no band-pass filter of the amplifier circuit 13 is provided.

IN1: first input terminal
IN2: second input terminal
OUT1: first output terminal
OUT2: second output terminal
P: piezoelectric device
10, 30: piezoelectric device drive circuits
11: H-bridge circuit
12: LPF differential amplifier circuit
13: BPF amplifier circuit
14: inverting circuit
15: resistor (current detecting resistor)
16: resistor
17: comparator (first slew rate increasing circuit)
18: comparator (second slew rate increasing circuit)
20: suction apparatus
21: battery
22: booster circuit
23: piezoelectric pump
31: low-pass filter (first low-pass filter)
32: low-pass filter (second low-pass filter)

The invention claimed is:

1. A piezoelectric device drive circuit applying a drive signal to a piezoelectric device, comprising:
    an H-bridge circuit including a first input terminal, a second input terminal, a first output terminal, and a second output terminal, the first output terminal and the second output terminal being connected to the piezoelectric device;
    a current detecting resistor connected between the piezoelectric device and the first output terminal;
    a differential amplifier circuit receiving voltages at two ends of the current detecting resistor;
    an inverting circuit having an input terminal connected to an output terminal of the differential amplifier circuit;
    a first slew rate increasing circuit having an input terminal directly connected to an input terminal of the inverting circuit and an output terminal connected to the first input terminal; and
    a second slew rate increasing circuit having an input terminal connected to an output terminal of the inverting circuit and an output terminal connected to the second input terminal.

2. The piezoelectric device drive circuit according to claim 1, wherein the first slew rate increasing circuit and the second slew rate increasing circuit each output a rectangular wave with a duty ratio of 50%.

3. The piezoelectric device drive circuit according to claim 1, further comprising:

a first low-pass filter connected between the first input terminal and the output terminal of the first slew rate increasing circuit; and a second low-pass filter connected between the second input terminal and the output terminal of the second slew rate increasing circuit.

4. A suction apparatus performing suction using a piezoelectric pump driven by the piezoelectric device drive circuit according to claim 1.

5. A suction apparatus performing suction using a piezoelectric pump driven by the piezoelectric device drive circuit according to claim 2.

6. A suction apparatus performing suction using a piezoelectric pump driven by the piezoelectric device drive circuit according to claim 3.

7. The piezoelectric device drive circuit according to claim 1, wherein:

the first slew rate increasing circuit outputs a first control signal to the first input terminal;

the second slew rate increasing circuit outputs a second control signal to the second input terminal; and the first control signal and the second control signal have the same waveform and the same phase.

8. The piezoelectric device drive circuit according to claim 7, wherein the drive signal applied to the piezoelectric device has twice the amplitude of the first control signal or the second control signal.

* * * * *